(12) United States Patent
Meister

(10) Patent No.: US 12,429,537 B2
(45) Date of Patent: Sep. 30, 2025

(54) MONITORING DEVICE FOR TEMPERATURE-CONTROLLED CAPILLARY GUIDANCE HAVING NESTED TUBES AND TRANSPORT CAPILLARIES FOR NMR FLOW CELLS

(71) Applicant: BRUKER SWITZERLAND AG, Fällanden (CH)

(72) Inventor: Roger Meister, Hinteregg (CH)

( * ) Notice: Subject to any disclaimer, the term of this patent is extended or adjusted under 35 U.S.C. 154(b) by 9 days.

(21) Appl. No.: 18/559,433

(22) PCT Filed: Aug. 5, 2022

(86) PCT No.: PCT/EP2022/072071
§ 371 (c)(1),
(2) Date: Nov. 7, 2023

(87) PCT Pub. No.: WO2023/072449
PCT Pub. Date: May 4, 2023

(65) Prior Publication Data
US 2024/0241196 A1  Jul. 18, 2024

(30) Foreign Application Priority Data
Oct. 29, 2021 (DE) .................. 20 2021 105 945.1

(51) Int. Cl.
| | | |
|---|---|---|
| G01R 33/30 | (2006.01) | |
| G01N 24/08 | (2006.01) | |
| G01R 33/31 | (2006.01) | |

(52) U.S. Cl.
CPC ......... G01R 33/307 (2013.01); G01N 24/082 (2013.01); G01R 33/31 (2013.01)

(58) Field of Classification Search
CPC .... G01R 33/307; G01R 33/31; G01N 24/082; G01N 24/088
See application file for complete search history.

(56) References Cited

U.S. PATENT DOCUMENTS

| | | |
|---|---|---|
| 11,073,583 B2 | 7/2021 | Meister et al. |
| 2012/0092013 A1* | 4/2012 | Marquez ............ G01N 24/08 324/318 |
| 2016/0290941 A1 | 10/2016 | Hofmann |

FOREIGN PATENT DOCUMENTS

| | | |
|---|---|---|
| DE | 102015206030 B3 | 4/2016 |
| EP | 1116044 B1 | 12/2008 |

(Continued)

OTHER PUBLICATIONS

Foley, David A., et al. NMR flow tube for online NMR reaction monitoring. Analytical chemistry, 2014, 86. Jg., Nr. 24, S. 12008-12013.

(Continued)

Primary Examiner — G. M. A Hyder
(74) Attorney, Agent, or Firm — Benoît & Côté Inc.

(57) ABSTRACT

A monitoring device (100) for performing a measurement of a reaction liquid (102) produced in a reaction tank (101) in an NMR spectrometer (103), the device comprising the following components:
a hollow NMR sample probe (104) for receiving the reaction liquid to be measured; an inlet transport capillary (105) for receiving the reaction liquid from the reaction tank and for transport from the reaction tank via a pump device (106) to the sample probe; an outlet transport capillary (108) for the return transport of the reaction liquid from the sample probe to the reaction tank; a device (10) for conducting temperature-control fluid (25) around the inlet and outlet transport capillaries, the device for conducting temperature control-fluid comprising tube portions (23), each of which is constructed in double-walled fashion from two radially closed partial tubes arranged nested in one another, comprising an outer partial tube (19) and an inner partial tube (21), the temperature-control fluid flowing between the outer and the inner partial tube, and the inlet transport capillary or the outlet transport capillary being arranged radially within the inner partial tube, is characterized in that the monitoring device has a closed temperature-control circuit for the temperature-control fluid, which circuit is geometrically designed such that the temperature-control fluid always flows only in a (Continued)

predetermined direction in each spatial region of the temperature-control circuit and no opposing flow of the temperature-control fluid in the immediate vicinity of the spatial region occurs.

As a result, the reaction liquid is constantly and completely temperature-controlled in a uniform manner over its entire transport path.

15 Claims, 4 Drawing Sheets

(56) References Cited

FOREIGN PATENT DOCUMENTS

| EP | 2407796 B1 | 1/2012 |
|----|------------|--------|
| EP | 3715893 A1 | 2/2021 |

OTHER PUBLICATIONS

Brächer A et al: "Thermostatted micro-reactor NMR probe head for monitoring fast reactions", Journal of Magnetic Resonance, Bd. 242, Mar. 1, 2014.

InsightMR, Bruker Corporation, Billerica, Massachusetts, USA, published on Apr. 15, 2015 (as poster on the ENC 2015 conference).

* cited by examiner

MONITORING DEVICE FOR TEMPERATURE-CONTROLLED CAPILLARY GUIDANCE HAVING NESTED TUBES AND TRANSPORT CAPILLARIES FOR NMR FLOW CELLS

The invention relates to a monitoring device for performing a measurement of a reaction liquid produced in a reaction tank in an NMR spectrometer, in particular for controlling a chemical reaction by means of NMR spectroscopy, the monitoring device having at least the following components:
- a hollow NMR sample probe for receiving the reaction fluid to be measured in the NMR spectrometer;
- an inlet transport capillary for receiving the reaction liquid from the reaction tank and for transporting the reaction liquid from the reaction tank via a pump device toward the sample probe;
- an outlet transport capillary for the return transport of the reaction liquid from the sample probe to the reaction tank;
- a device for conducting temperature-control fluid around the inlet and outlet transport capillaries,
- the device for conducting temperature-control fluid around the inlet and outlet transport capillaries having tube portions which are each constructed in a double-walled manner from two radially closed partial tubes arranged nested in one another, having an outer partial tube and an inner partial tube, the temperature-control fluid flowing between the outer and the inner partial tube, and the inlet transport capillary or the outlet transport capillary being arranged radially within the inner partial tube.

Such a monitoring device is known from the publication FOLEY, David A, et al. "NMR flow tube for online NMR reaction monitoring" Analytical chemistry, 2024, vol. 86, no. 24, pp. 12008-12013 (=reference [0]).

BACKGROUND OF THE INVENTION

The present invention deals quite generally with the field of nuclear magnetic resonance ("NMR"), in particular with monitoring devices for performing NMR measurements of reaction fluids in real time under temperature-controlled conditions.

NMR spectroscopy is a widespread and efficient method in instrumental analysis. With the aid of NMR spectroscopy, the electronic environment of individual atoms and the interaction of the individual atoms with the adjacent atoms can be examined in a substance to be examined, such as a hydrocarbon or a bio-inorganic complex compound. In this way, for example the composition, structure and dynamics of the substance to be examined can be made clear, and the concentration of the substance to be examined can likewise be determined.

Typically, when measuring substances in liquid form, an NMR tube is filled with the substance to be examined. To perform the measurement, the filled NMR tube is placed within the measuring zone of an NMR sample head of an NMR spectrometer. There, the substance is exposed to a strong static, homogeneous magnetic field $B_0$, which aligns the nuclear spins in the substance. High-frequency electromagnetic pulses are then radiated into the substance to be examined. The high-frequency electromagnetic fields generated in this way are detected in the NMR spectrometer. Information about the properties of the examined substance can then be obtained from this.

Measurements of substances in liquid form can take place as individual measurements, in which the substances are introduced individually into the NMR tubes, measured, and removed again. However, applications using what are known as "NMR flow cells" are of particular interest.

By means of NMR flow cells, chemical reactions can be observed in real time and under reaction conditions. For this purpose, the substance to be examined ("reaction liquid") is conveyed rapidly and continuously to a hollow NMR sample probe and through the hollow NMR sample probe, from a reaction tank in which the reaction liquid is generally produced. The NMR sample probe is located in an NMR spectrometer. While the reaction liquid is guided through the NMR sample probe, NMR measurements occur simultaneously. In this way, continuous monitoring of the reaction liquid (and thus of the reaction process in the reaction tank) is achieved by the NMR measurements.

In applications in the field of the NMR flow cells, capillaries are typically used for the delivery of the substance to be examined ("measurement medium"). The capillaries are usually made of plastics material and have an outer diameter of 1/16" (≈0.16 cm) or 1/32" (≈0.08 cm). Often, the entire system is constructed such that the measurement medium is conveyed from a reactor ("reaction tank") to a pump. From the pump, it is then conveyed further to the NMR measuring device and from there back to the reactor.

In the reactor, a particular temperature usually prevails during the measurement. This should ensure, inter alia, that the chemical reactions in the reaction tank proceed uniformly and in a controlled manner, that and the following NMR measurements are comparable to one another. In order that this particular temperature for the measuring medium remains as constant as possible on its path, the capillaries can be temperature-controlled at least in part.

For high-field systems, for example, the "InsightMR" system of Bruker Corporation, Billerica, Massachusetts, USA (=reference [3]) is used. In this system, the capillary region between the pump and the NMR system, and between the NMR system and the reactor, is temperature-controlled. However, the temperature control does not take place over the entire length. Furthermore, the portion between the reactor and the pump is completely non-temperature-controlled. The temperature-controlled region, in which the capillary is guided, is designed as an insulated tube. In this insulated tube, the temperature-control medium flows directly around the capillary.

A disadvantage of this system is that it has been developed specifically for high-field systems and also functions well only in this application. An adaptation to different systems and environments in other fields is not possible. Furthermore, no parts can be used in which the capillary can be guided in a temperature-controlled manner. Likewise, a simple replacement of the capillary, for example in the case of a blockage, is not possible. The temperature-control liquid must first be discharged from the entire insulated tube before the capillary can be replaced.

EP 2 407 796 B1 (=reference [2]) describes a monitoring cell by means of which measurements of a reaction liquid produced in a reaction tank can be performed in an NMR spectrometer. The monitoring cell comprises a hollow NMR sample probe and a housing having an inlet transport capillary for receiving the reaction liquid from the reaction tank, and an outlet transport capillary for discharging the reaction liquid back into the reaction tank. Furthermore, the housing of the monitoring cell comprises a device for conducting coolant around the inlet transport capillary and the outlet transport capillary. The inlet transport capillary and the outlet transport capillary are guided through a cavity. The cavity is connected to the device for conducting coolant. During a measurement, coolant flows through the cavity.

If, for example, a blockage of one of the capillaries occurs, the entire coolant must again first be discharged, in order that the clogged capillary can then subsequently be removed. In the event of a leak or damage to the capillary, reaction liquid can additionally also escape and contaminate the coolant. This can make necessary complex cleaning of the device for conducting coolant, and lead to sometimes expensive disposal of the contaminated coolant. Furthermore, the device for conducting the coolant is designed specifically for this system, and cannot be adapted to other systems.

DE 10 2015 206 030 B3 (=reference [1]) also proposes a monitoring cell by means of which measurements of a reaction liquid produced in a reaction tank can be performed in an NMR spectrometer. In a manner similar to that described in reference [2], the monitoring cell comprises a hollow NMR sample probe and a housing having an inlet transport capillary for receiving the reaction liquid from the reaction tank and an outlet transport capillary for discharging the reaction liquid back into the reaction tank. Furthermore, the housing of the monitoring cell comprises a device for conducting temperature-control fluid, comprising a supply line and comprising a discharge line for the temperature-control fluid into the monitoring cell. The transport capillaries are guided within the supply line of the temperature-control fluid, and the supply line is surrounded coaxially by the discharge line. During a measurement, the transport capillaries are thus in direct contact with the temperature-control fluid in this case too.

If, for example, a blockage of one of the capillaries occurs, the temperature-control medium must also first be discharged in this monitoring cell, in order that the clogged capillary can be removed. In the event of a leak or damage to the capillary, reaction liquid can additionally also escape here and contaminate the temperature-control fluid. This can in turn result in complex cleaning of the device for conducting temperature-control fluid and lead to sometimes expensive disposal of the contaminated temperature-control fluid. Furthermore, the device for conducting the temperature-control fluid is, in this case too, specifically designed for this system, and cannot be adapted to other systems.

The reference [0] cited at the outset describes a monitoring cell, generic for the present invention, having all feature complexes defined in the 1st paragraph of the above first description page. This monitoring cell is in turn operated in flow mode ("NMR Flow Tube for Online NMR Reaction Monitoring"). However, here the temperature-control fluid does not only flow in a single direction, but is conveyed back and forth in three coaxial tubes. Thus, it is not possible to ensure a truly uniform temperature control of the liquid NMR sample over the entire transport route from the reaction tank into the NMR spectrometer and back again.

OBJECT OF THE INVENTION

In contrast, the present invention is based on the object of designing the device for conducting temperature-control fluid around the inlet and outlet transport capillaries, in a monitoring device of the type described at the outset for performing a measurement of a reaction liquid produced in a reaction tank in an NMR spectrometer, by uncomplicated technical means, in such a way that the inlet and outlet transport capillaries can be replaced without problem at any time, that the device for conducting temperature-control fluid can be used universally in other use environments too, and that during operation the inlet and outlet transport capillaries are always and completely uniformly temperature-controlled.

BRIEF DESCRIPTION OF THE INVENTION

This object is achieved by the present invention in a manner that is as surprising as it is effective, in that the monitoring device has a closed temperature-control circuit for the temperature-control fluid, which circuit is geometrically designed in such a way that the temperature-control fluid always flows only in a predetermined direction, in each spatial region of the temperature-control circuit, and no opposing flow of the temperature-control fluid in the immediate vicinity of the spatial region occurs.

The present invention therefore proposes, instead of transporting the liquid NMR sample in three coaxial tubes, from the reaction tank into the NMR spectrometer and back again, as disclosed in reference [0], rather modifying the device such that, at each point of the device, the reaction liquid and also the temperature-control fluid always flow only in a single flow direction. This is achieved by the design according to the invention of a coolant circuit, the tubes of which are furthermore designed to be significantly more compact and technically less complex than the triple tube proposed in reference [0]. The circulation of the fluids according to the invention implies a spatial separation of the temperature-control fluid, flowing from the reaction tank to the NMR spectrometer, from the temperature-control fluid flowing back from the NMR spectrometer to the reaction tank. Thus, a completely uniform temperature control of the reaction liquid over the entire transport path can now be ensured.

In addition, a strict separation between the inlet and outlet transport capillaries ("transport capillaries") and the temperature-control fluid is established. For this purpose, double-walled tube portions are configured, which are each constructed from an outer partial tube and an inner partial tube which is arranged inside the outer partial tube. The temperature-control fluid flows in an intermediate region between the outer partial tube and the inner partial tube. No temperature-control fluid flows within the inner partial tube. The transport capillaries are arranged within the inner partial tube, which is free of temperature-control fluid.

As a result of this embodiment according to the invention, the transport capillaries can be inserted into or removed from the double-walled tube portion in a simple manner and in a time-saving manner, for example by simply pushing the respective transport capillary into the inner partial tube. Laborious disassembly and assembly of the device for conducting temperature-control fluid, hitherto usually required, is not necessary.

Due to the spatial separation of the temperature-control fluid by the structural configuration of the double-walled tube portions and the transport capillaries, the device for conducting temperature-control fluid can be used in an extremely flexible manner. In other words, the device designed according to the invention for conducting temperature-control fluid can be used for very different structural situations of the monitoring device and is not limited to a particular, special design.

If a problem occurs on a transport capillary during a measurement of the reaction liquid, for example a blockage or damage to the transport capillary, said transport capillary can be easily pulled promptly out of the inner partial tube. In particular, the temperature-control fluid does not have to first be discharged before the corresponding transport capillary can be removed. The transport capillary can thus be removed without problem, while temperature-control fluid continues to flow in the intermediate region between the outer partial tube and the inner partial tube. Impurities in the inner partial tube can easily be removed very effectively, for example by passing a solvent through the inner region of the inner partial tube.

Due to the spatial separation of temperature-control fluid and transport capillary, in the case of damage to the transport capillary it is possible to effectively prevent the temperature-control fluid from coming into contact with the reaction liquid due to a leak. The risk of an undesired reaction of the temperature-control fluid with the reaction liquid can thus be ruled out. Contamination between the temperature-control fluid and the reaction liquid can also be prevented. An often cost-intensive disposal of the contaminated temperature-control fluid and/or the contaminated reaction liquid is counteracted in this way.

When a plurality of transport capillaries are used in the device for conducting temperature-control fluid during a measurement, in the event of problems in one transport capillary, which results in a replacement of the corresponding transport capillary, the remaining transport capillaries can continue to be temperature-controlled. The measurement of the reaction liquid in the remaining transport capillaries can be easily continued without interruption.

The inner partial tube and the outer partial tube are each radially closed partial tubes. The transport capillaries are arranged radially within the inner partial tube. Due to the radially inner partial tube and the transport capillary arranged radially within the inner partial tube being the same shape, an effective and uniform temperature control of the transport capillary (and thus of the reaction liquid) using the temperature-control fluid can be achieved. The effectiveness of the temperature control can be further increased by reducing the distance between the inner partial tube and the transport capillary.

The tube portions can be made of a chemically inert plastics material, for example PTFE. In this way, in the event of a leak of a transport capillary, it is possible to prevent the corresponding tube portion from being damaged by the escaping reaction liquid.

In accordance with the temperature range required for the reaction liquid, for example demineralized water (DM water), 2-propanol (isopropanol), or a temperature-control oil, can be used as the temperature-control fluid. The temperature-control fluid can be conducted by means of a temperature-control fluid pump ("fluid pump") through the device for conducting temperature-control fluid.

PREFERRED EMBODIMENTS AND DEVELOPMENTS OF THE INVENTION

In very particularly preferred embodiments of the monitoring device according to the invention, it is provided that the inner partial tubes are arranged concentrically with respect to the outer partial tubes.

This arrangement can be easily implemented and set up in practice. Due to the uniform spacing between the inner partial tubes and the outer partial tubes in the radial direction, the temperature-control fluid can disperse evenly in an intermediate space between the inner partial tubes and the outer partial tubes. Uniform temperature control of the inlet and outlet transport capillaries can thus be made possible.

A preferred class of embodiments of the monitoring device according to the invention is characterized in that the inner partial tubes are geometrically designed such that the inlet transport capillary and the outlet transport capillary can be inserted into the inner partial tubes and also pulled out of them again.

As a result, the inlet transport capillary and the outlet transport capillary can be replaced quickly and in an uncomplicated manner, for example when the corresponding capillary is clogged or damaged. The device for conducting temperature-control fluid therefore does not have to be taken apart in a time-consuming manner in order that the corresponding capillary can be replaced.

In preferred developments of this class of embodiments, the inner diameters of the inner partial tubes are designed so as to be larger than or equal to the outer diameters of the corresponding inlet transport capillary or the corresponding outlet transport capillary.

In the case of an inner diameter of the inner partial tubes which is larger than the outer diameter of the corresponding inlet transport capillary or the corresponding outlet transport capillary, the corresponding inlet transport capillary or the corresponding outlet transport capillary can be inserted comfortably into the inner partial tubes. In the case of an inner diameter of the inner partial tubes which is approximately equal to the outer diameter of the corresponding inlet transport capillary or the corresponding outlet transport capillary, the corresponding inlet transport capillary or the corresponding outlet transport capillary can be arranged in a flush manner in the inner partial tubes. The inner partial tubes and the corresponding inlet transport capillary or the corresponding outlet transport capillary are directly adjacent to one another, as a result of which the temperature of the temperature-control fluid can be transferred well. Furthermore, slippage of the corresponding inlet transport capillary or the corresponding outlet transport capillary can be made more difficult.

Further developments of these developments are further preferred, which are characterized in that at least the inner partial tubes are made of a material comprising sliding materials having coefficients of friction $\mu \le 1$, preferably $\mu \le 0.1$, in particular $\mu \le 0.05$, and/or an expandable material.

As a result, the corresponding inlet transport capillary or the corresponding outlet transport capillary can be inserted into the inner partial tubes particularly simply and comfortably, in a low-friction manner. In the case of inner partial tubes made of an expandable material, the corresponding transport capillaries can be introduced into the inner partial tubes under expansion of the expandable material. In addition, the expandable material may be tightly placed around the corresponding transport capillaries. The temperature of the temperature-control fluid can then be transferred to the corresponding transport capillaries with low loss, and the transport capillaries can be kept in position in a stable manner.

A class of embodiments is also preferred in which the double-walled tube portions of the device for conducting temperature-control fluid around the inlet and outlet transport capillaries are constructed as a kit system which can be adapted to different user requirements, NMR spectrometers and environments, and in which the double-walled tube portions are present as respectively independent, in particular replaceable, units.

In this case, the double-walled tube portions are constructed as a kit system, can be used in a versatile manner, and offer high flexibility for different situations. A time-consuming reconfiguration of the device for conducting temperature-control fluid is omitted. Since the double-walled tube portions are designed as independent units, they can be replaced in a simple manner, for example in the event of damage or a leak of the double-walled tube portions. With the aid of these independent units, costs can be saved and time-consuming maintenance can also be avoided.

Further developments of this class of embodiments are further preferred in which the double-walled tube portions are designed as closed units of a predetermined length in each case, in particular having a length of 2 m.

In this way, the double-walled tube portions can be standardized and produced in large quantities. The replacement of double-walled tube portions can thus be greatly simplified. The device for conducting temperature-control fluid remains virtually unchanged even after the replacement.

Embodiments of the monitoring device according to the invention are also particularly preferred in which the device for conducting temperature-control fluid around the inlet and outlet transport capillaries comprises end pieces for connecting the double-walled tube portions to a fluid pump.

This can be easily implemented in practice: the end pieces, and thus the double-walled tube portions, can be connected to the pump device in a simple manner, and the temperature-control fluid can be made available for the double-walled tube portions via the pump device. The end pieces can also improve the stability of the device for conducting temperature-control fluid.

In preferred developments of these embodiments, at least some of the end pieces are designed as multiple variants for simultaneously receiving a plurality of inlet or outlet transport capillaries for different reaction fluids.

These end pieces are thus designed such that a plurality of reaction fluids can be guided simultaneously through the device for conducting temperature-control fluid, through the inlet or outlet transport capillaries. The plurality of reaction fluids can then be guided for example simultaneously or in quick succession into the hollow NMR sample probe and measured. This allows time and costs to be saved. Furthermore, it is possible to design new and structurally different test constructions in a simple manner.

Further developments of these developments are also preferred which are characterized in that the multiple-variant end piece is designed such that it can receive a plurality of, preferably three, inlet or outlet transport capillaries, but only one double-walled tube portion, by means of which all the accommodated capillaries can be temperature-controlled at the same time via a temperature-control channel extending in a meandering manner through the multiple-variant end piece.

By means of the possibility of being able to receive a plurality of inlet or transport capillaries in the multiple-variant end piece, different temperature-controlled reaction liquids can simultaneously be guided into the hollow NMR sample probe and discharged from the hollow NMR sample probe. By using only one double-walled tube portion, uniform temperature control of all the received capillaries can be achieved. The double-walled tube portion is designed such that it can accommodate the plurality of inlet or outlet transport capillaries without problem.

It is also preferred, in these further developments, that the multiple-variant end piece has two end portions opposite one another, which are designed to receive two different capillaries in each case and for connection, in each case, of a double-walled tube portion, in such a way that at least two intermediate portions, opposite one another in each case, are provided, into which only one capillary each can be inserted, and that the end portions are connected to the intermediate portions in such a way that the double-walled tube portion connected to the respective end portion is connected to an intermediate portion arranged directly adjacently to the end portion.

This structure has proven particularly successful in practice. The space requirement at the two opposite end portions can be reduced and the available space can be optimally used, since both the receptacles for two different capillaries in each case, and the connection for a double-walled tube portion in each case are present. The space can also be optimally used in the at least two intermediate portions opposite one another, and the double-walled tube portion connected to the respective end portions can be implemented.

Further preferably, in these further developments it is provided that, between the end portions and the intermediate portions on one side of the multiple-variant end piece, and the end portions and the intermediate portions on the opposite other side of the multi-variant end piece, central pieces are arranged in each case, through which a single capillary is guided in each case, which is surrounded by the temperature-control channel of the multi-variant end piece.

The individual capillaries can be protected from damage and environmental influences by means of the central pieces. Furthermore, the device for conducting temperature-control fluid can be further stabilized by the central pieces.

Developments of the above-described embodiments of the monitoring device according to the invention are also preferred in which the outer partial tube and the inner partial tube of the double-walled tube portion are inserted to different extents into the end piece, the inner partial tube preferably to a greater length than the outer partial tube.

In this way, the corresponding capillary, which is inserted into the inner partial tube, can be sealed particularly easily with respect to the outer partial tube and the temperature-control fluid which is guided through between the outer partial tube and the inner partial tube. In addition, the temperature-control fluid can be guided in an uncomplicated manner into the intermediate space between the inner partial tube and the outer partial tube.

In a further, particularly preferred class of embodiments of the monitoring device according to the invention, it is provided that the transport capillaries have identically dimensioned outer dimensions.

As a result, the structure of the device for conducting temperature-control fluid can be designed uniformly, and thus the use of the monitoring device according to the invention can be made easier.

Embodiments are also preferred in which the transport capillaries are made of chemically inert plastics material, preferably of PTFE.

In this way, it can be ensured that the transport capillaries are not damaged by the reaction liquid produced in the reaction tank, or components are released from the transport capillaries which contaminate the reaction liquid produced and can make the measurements performed unusable.

Further advantages of the invention will become apparent from the description and the drawings. The embodiments shown and described are not to be understood as an exhaustive list but instead are of an exemplary nature for describing the invention.

DETAILED DESCRIPTION OF THE INVENTION AND DRAWINGS

The invention is illustrated in the drawings and will be explained in more detail with reference to embodiments.

Figure 1A:
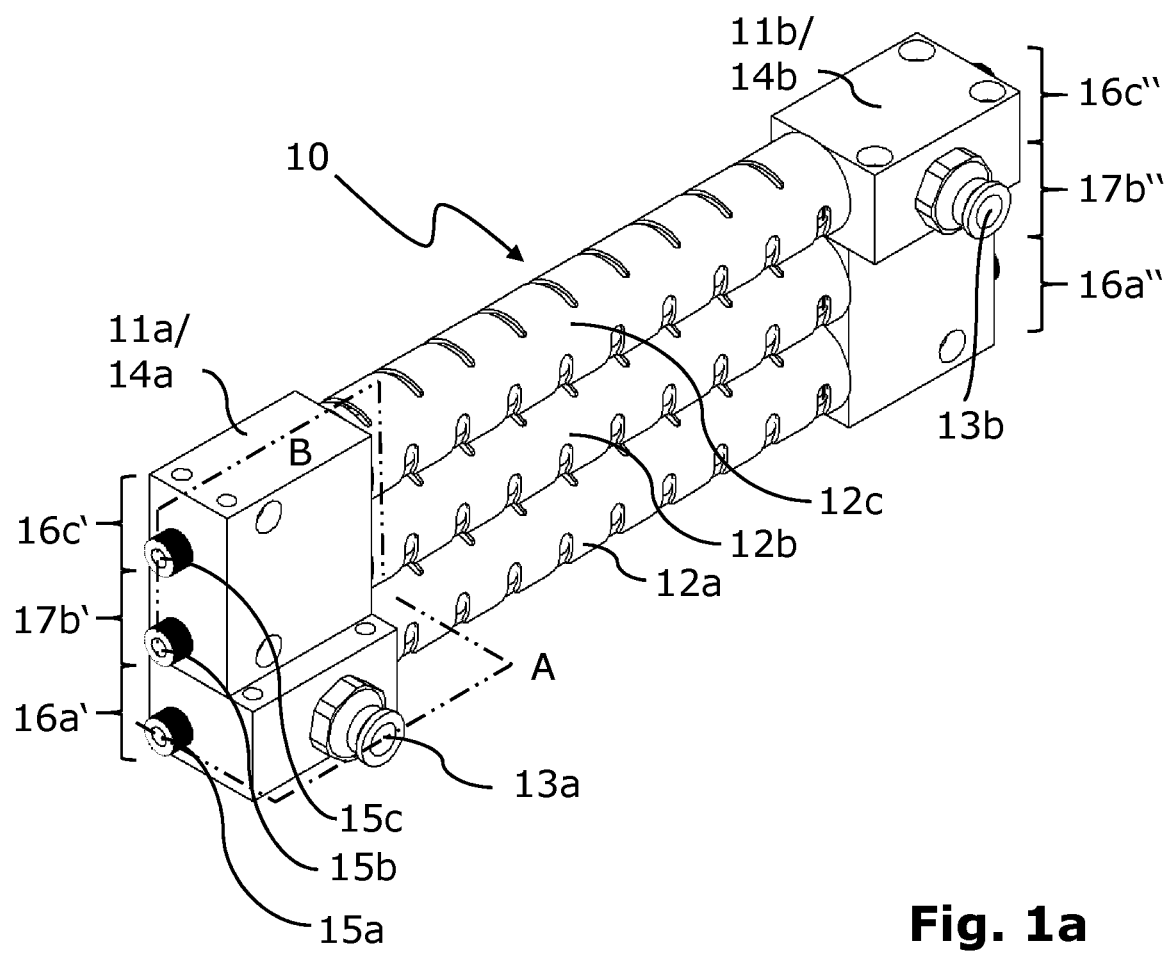
FIG. 1a is a perspective view, obliquely from above, of a device for conducting temperature-control fluid of a monitoring device according to the invention in a first embodiment, comprising end pieces which are designed as multiple variants for receiving a plurality of inlet or outlet transport capillaries.

FIG. 1a is a perspective view of a first embodiment of a device 10 for conducting temperature-control fluid around inlet and outlet transport capillaries of a monitoring device according to the invention. In the embodiment shown here, the device 10 comprises two end pieces 11a, 11b, between which three central pieces 12a, 12b, 12c are arranged. Furthermore, the two mutually perpendicular sectional planes A and B are shown.

In this case, the end piece 11a has a fluid connection 13a; the end piece 11b has a fluid connection 13b. Via the fluid connections 13a, 13b, the device 10 for conducting temperature-control fluid is connected to a fluid pump, by means of which a temperature-control fluid can be introduced into the device 10 and discharged again (see FIG. 4). In the embodiment shown here, a temperature-control channel and a double-walled tube portion extend within the device 10. The temperature-control channel extends in a meandering manner within the end pieces 11a, 11b; the double-walled tube portion extends in the central pieces 12a, 12b, 12c between the end pieces 11a, 11b (see FIG. 2).

The temperature-control fluid is guided through the device 10, through the temperature-control channel and the double-walled tube portion. In this case, the temperature-control fluid is introduced at the fluid connection 13a and guided via the central piece 12a to the end piece 11b. From there, the temperature-control fluid is returned to the end piece 11a via the central piece 12b. The temperature-control fluid is then guided from the end piece 11a, via the central piece 12c, to the fluid connection 13b, and discharged from the device 10. Uniform temperature control in the entire device 10 can be achieved.

The end pieces 11a, 11b in FIG. 1a are designed as multiple variants ("multiple-variant end pieces") 14a, 14b, by means of which a plurality of inlet or outlet transport capillaries can be received. In the embodiment shown here, no transport capillaries are inserted into the multiple-variant end pieces 14a, 14b. In further embodiments (not shown), however, it is possible for one, two or three transport capillaries to be inserted into the multiple-variant end pieces 14a, 14b. For example, two inlet transport capillaries comprising different reaction fluids, and an outlet transport capillary for discharging the reaction fluids, can be introduced into the multiple-variant end pieces 14a, 14b.

Furthermore, the end pieces 11a, 11b in the embodiment shown here have three capillary receptacles 15a, 15b, 15c. The capillary receptacles 15a, 15b, 15c are connected to feedthroughs leading through the end pieces 11a, 11b and the central pieces 12a, 12b, 12c (not shown in greater detail).

The multiple-variant end piece 14a in this case has two mutually opposing end portions 16a', 16c' and one intermediate portion 17b'; the multi-variant end piece 14b has two mutually opposing end portions 16a'', 16c'' and one intermediate portion 17b''. The end portions 16a', 16a'' comprise the fluid connection 13a, the capillary receptacle 15a and the central piece 12a. The end portions 16c', 16c'' comprise the fluid connection 13b, the capillary receptacle 15c and the central piece 12c. The intermediate portions 17b', 17b'' comprise the capillary receptacle 15b and the central piece 12b. The end portions 16a'' are connected to the intermediate portion 17b'', and the end portion 17c' is connected to the intermediate portions 17b'.

In the embodiment shown here, the two end pieces 11a, 11b are each formed having two cuboid components. The three central pieces 12a, 12b, 12c are formed having cylindrical components.

Figure 1B:
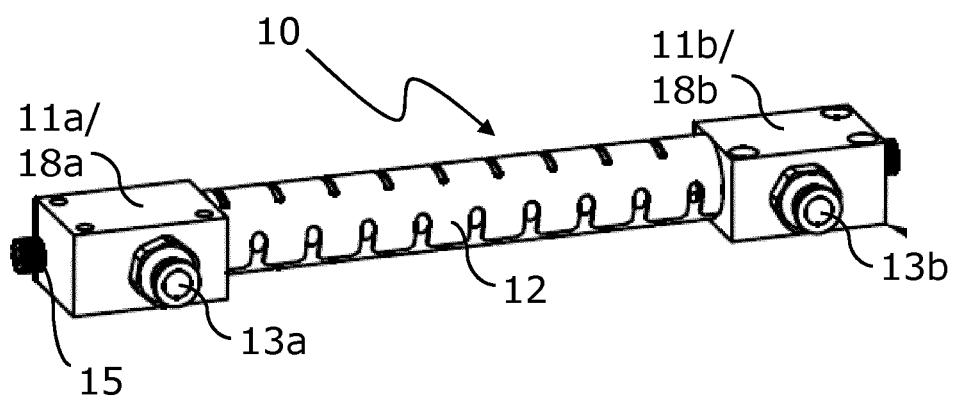
FIG. 1b is a perspective view of a device for conducting temperature-control fluid of a monitoring device according to the invention in a second embodiment comprising end pieces which are designed as a single variant for receiving only one inlet or outlet transport capillary.

FIG. 1b is a perspective view of a second embodiment of a device 10 for conducting temperature-control fluid around inlet and outlet transport capillaries of a monitoring device according to the invention. In the embodiment shown here, the device 10 comprises two end pieces 11a, 11b, between which a central piece 12 is arranged.

In this case, the end piece 11a comprises the fluid connection 13a, and the end piece 11b comprises the fluid connection 13b. Via the fluid connections 13a, 13b, the device 10 for conducting temperature-control fluid is connected to the fluid pump, through which a temperature-control fluid can be introduced into the device 10 and discharged again (see FIG. 4). The temperature-control channel extends within the end pieces 11a, 11b; the double-walled tube portion extends in the central piece 12b between the end pieces 11a, 11b (cf. FIG. 2).

The temperature-control fluid is guided through the device 10, through the temperature-control channel and the double-walled tube portion. The temperature-control fluid is fed to the end piece 11a at the fluid connection 13a, and is guided via the central piece 12 to the fluid connection 13b on the end piece 11b. As a result, uniform temperature control in the device 10 can be achieved.

The end pieces 11a, 11b are designed here as single variants ("single-variant end pieces") 18a, 18b by means of which a single inlet or outlet transport capillary can be received. In the embodiment shown here, however, no transport capillaries are introduced into the single-variant end pieces 18a, 18b.

Furthermore, the end pieces 11a, 11b have, in the embodiment shown in FIG. 1b, capillary receptacles 15. The capillary receptacles 15 are connected to a feedthrough leading through the end pieces 11a, 11b and the central piece 12 (not shown in greater detail).

In the embodiment shown here, the two end pieces 11a, 11b are each designed having a cuboid component, and the central piece 12 is designed as a cylindrical component.

Figure 2:
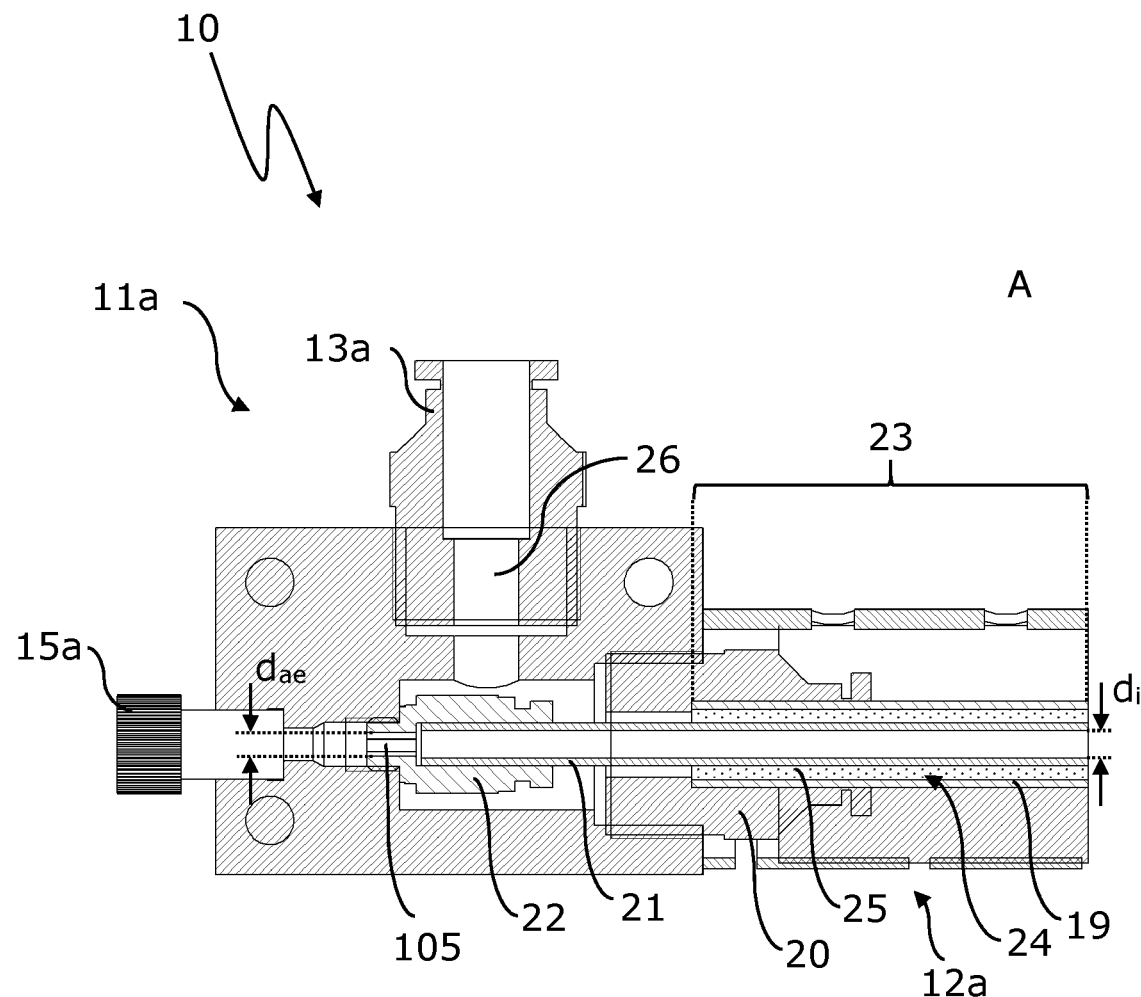
FIG. 2 is a detail of a schematic longitudinal sectional view of the device for conducting temperature-control fluid of FIG. 1a, in the plane A shown therein.

FIG. 2 is a detail of a schematic longitudinal sectional view of the device 10 of FIG. 1a, in the plane A therein. The longitudinal sectional view shows a part of the end piece 11a and a part of the central piece 12a.

In the embodiment shown here, an outer partial tube 19 is arranged centrally in the central piece 12a, which tube protrudes in a minimal manner into the end piece 11a and opens into an outer sealing sleeve 20. Furthermore, an inner partial tube 21 extends centrally in the central piece 12a, within the outer partial tube 19. The inner partial tube 21 extends axially far beyond halfway into the end piece 11a, and opens into an inner sealing sleeve 22. In this case, the inner partial tube 21 is arranged in an interleaved manner in the outer partial tube 19, in the central piece 12a. In this case, the inner partial tube 21 projects axially significantly beyond the outer partial tube 19.

The outer partial tube 19 is radially closed and has a cylindrical shape, as does the inner partial tube 21. In the embodiment shown here, the inner partial tube 21 has an internal diameter $d_i$ of generally about 0.16 cm. The inner partial tube 21 is arranged concentrically with respect to the outer partial tube 19.

In the region of the overlap of the outer partial tube 19 and the inner partial tube 21, thus in this case in the central piece 12a and to a minimal extent in the end piece 11a, the outer partial tube 19 and the inner partial tube 21 form the double-walled tube portion 23. The double-walled tube portion 23 comprises an intermediate region 24, through which the temperature-control fluid 25 is conducted. The double-walled tube portion 23 is connected to the temperature-control channel 26.

In the embodiment shown here, a cylindrically shaped inlet transport capillary 105 was introduced into the inner partial tube 21 via the capillary receptacle 15a on the end piece 11a. The inner partial tube 21 is geometrically adapted to the cylindrically shaped inlet transport capillary 105. For easier insertion (and subsequent removal) of the inlet transport capillary 105, the inner partial tube 21 is made of a material comprising sliding materials having a coefficient of friction of $\mu<0.05$. Alternatively, the inner partial tube 21 can also be constructed from an expandable material. In the embodiment shown here, the inlet transport capillary 105 is made of PTFE. This chemically inert plastics material can ensure that a reaction liquid guided through the inlet transport capillary 105 does not attack the inlet transport capillary 105 and cause a leak, for example.

An outer diameter $d_{ae}$ of the inlet transport capillary 105 is approximately 0.16 cm here. The outer diameter $d_{ae}$ of the inlet transport capillary 105 and the inner diameter $d_i$ of the inner partial tube 21 are thus approximately equal here. As a result, the inlet transport capillary 105 rests flush against the inner partial tube 21, as a result of which, on the one hand, good temperature control can be achieved when temperature-control fluid 25 flows in the intermediate region 24, and on the other hand a stable arrangement of the inlet transport capillary 105 in the inner partial tube 21 can be achieved. In a further embodiment (not shown), the inner diameter $d_i$ of the inner partial tube 21 can be larger than the outer diameter $d_a$ of the inlet transport capillary 105.

In order to control the temperature of the inserted inlet transport capillary 105 and the reaction liquid transported therein, the temperature-control fluid 25 is introduced into the device 10 via the fluid connection 13a. From there, it is then conveyed further, via the temperature-control channel 26, into the intermediate region 24 of the double-walled tube portion 23. Subsequently, the temperature-control fluid 25 is discharged via the fluid connection 13b (not shown in greater detail).

In the embodiment shown here, the double-walled tube portion 23 is present as an independent, replaceable unit and is constructed as a kit system. Furthermore, the double-walled tube portion 23 is provided here as a closed unit of a length of generally 2 m (only the first 10 cm of the double-walled tube portion 23 is indicated in the figure).

Figure 3:
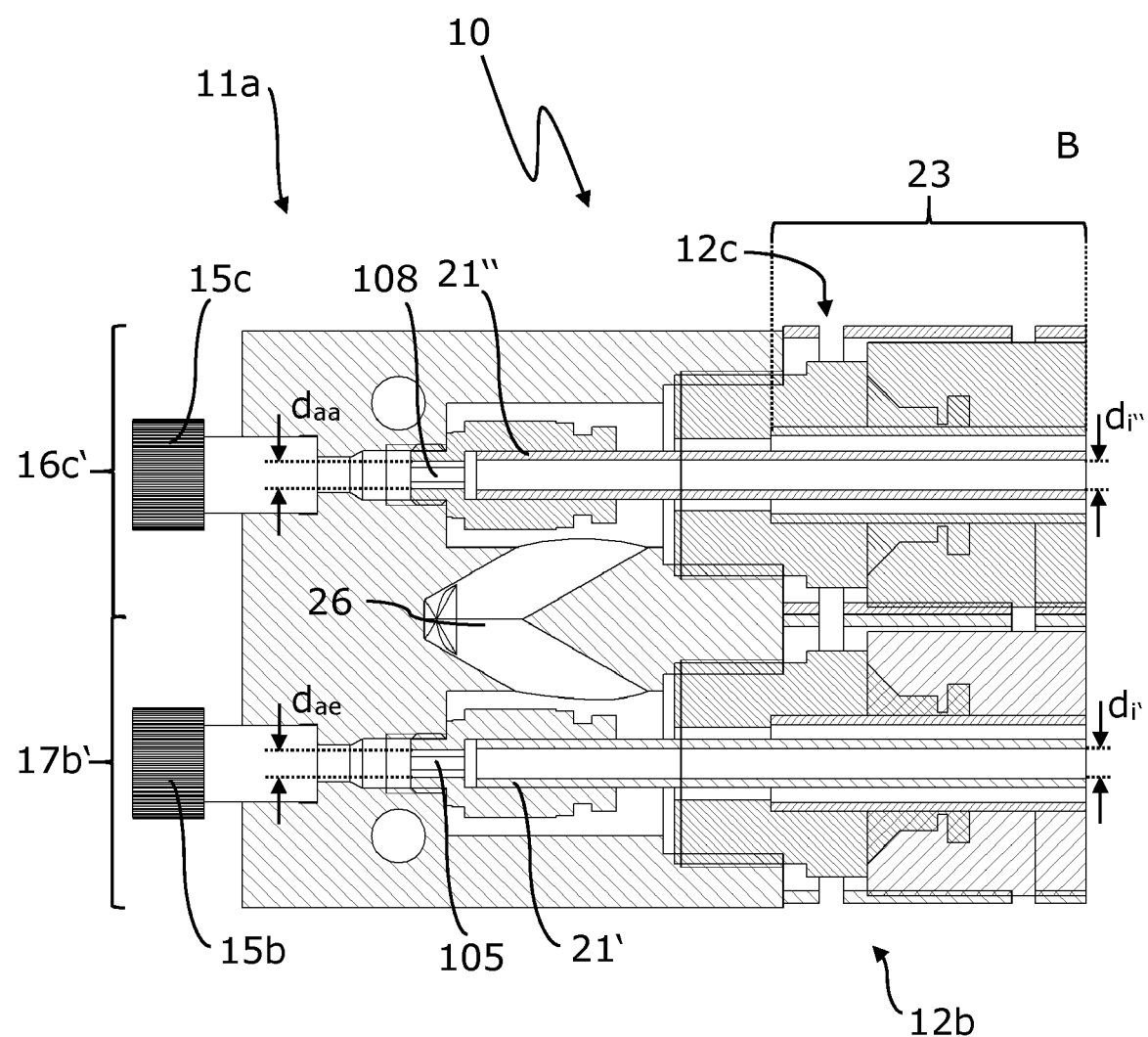
FIG. 3 is a detail of a schematic longitudinal sectional view of the device for conducting temperature-control fluid of FIG. 1a, in the plane B shown therein and perpendicular to the plane A.

FIG. 3 is a detail of a schematic longitudinal sectional view of the device 10 of FIG. 1a, in the plane B therein which is perpendicular to the plane A. The longitudinal sectional view shows a part of the end piece 11a, namely the end portion 16c' and the intermediate portion 17b' and a part of the central pieces 12b, 12c. The configuration of the double-walled tube portion 23 in FIG. 3 shown here is identical to the configuration of the double-walled tube portion 23 in FIG. 2.

In the embodiment shown in FIG. 3, the cylindrically shaped inlet transport capillary 105 has been inserted into the inner partial tube 21' via the capillary receptacle 15b on the end piece 11a, and a cylindrically shaped outlet transport capillary 108 has been inserted into the inner partial tube 21" via the capillary receptacle 15c on the end piece 11a. The inner partial tube 21' is geometrically adapted to the cylindrically shaped inlet transport capillary 105, and the inner partial tube 21" is geometrically adapted to the cylindrically shaped outlet transport capillary 108.

For easier insertion (and subsequent removal) of the transport capillaries 105, 108, the inner partial tubes 21', 21" are made of a material comprising sliding materials having a coefficient of friction of $\mu<0.05$. In the embodiment shown here, the transport capillaries 105, 108 are made of PTFE.

In this case, the outer diameter $d_{ae}$ of the inlet transport capillary 105 is generally approximately 0.16 cm; an outer diameter $d_{aa}$ of the outlet transport capillary 108 is also about 0.16 cm. The transport capillaries 105, 108 thus have identically dimensioned outer dimensions here. The outer diameters $d_{aa}$, $d_{ae}$ of the transport capillaries 105, 108 and the inner diameters $d_{i'}$, $d_{i''}$ of the inner partial tubes 21', 21", each being 0.16 cm, are approximately the same size. As a result, the transport capillaries 105, 108 rest flush on the inner partial tubes 21', 21".

For the uniform and simultaneous temperature control of the introduced transport capillaries 105, 108 and the reaction fluids transported therein, the parts of the double-walled tube portion 23 are connected to one another via the temperature-control channel 26.

Figure 4:
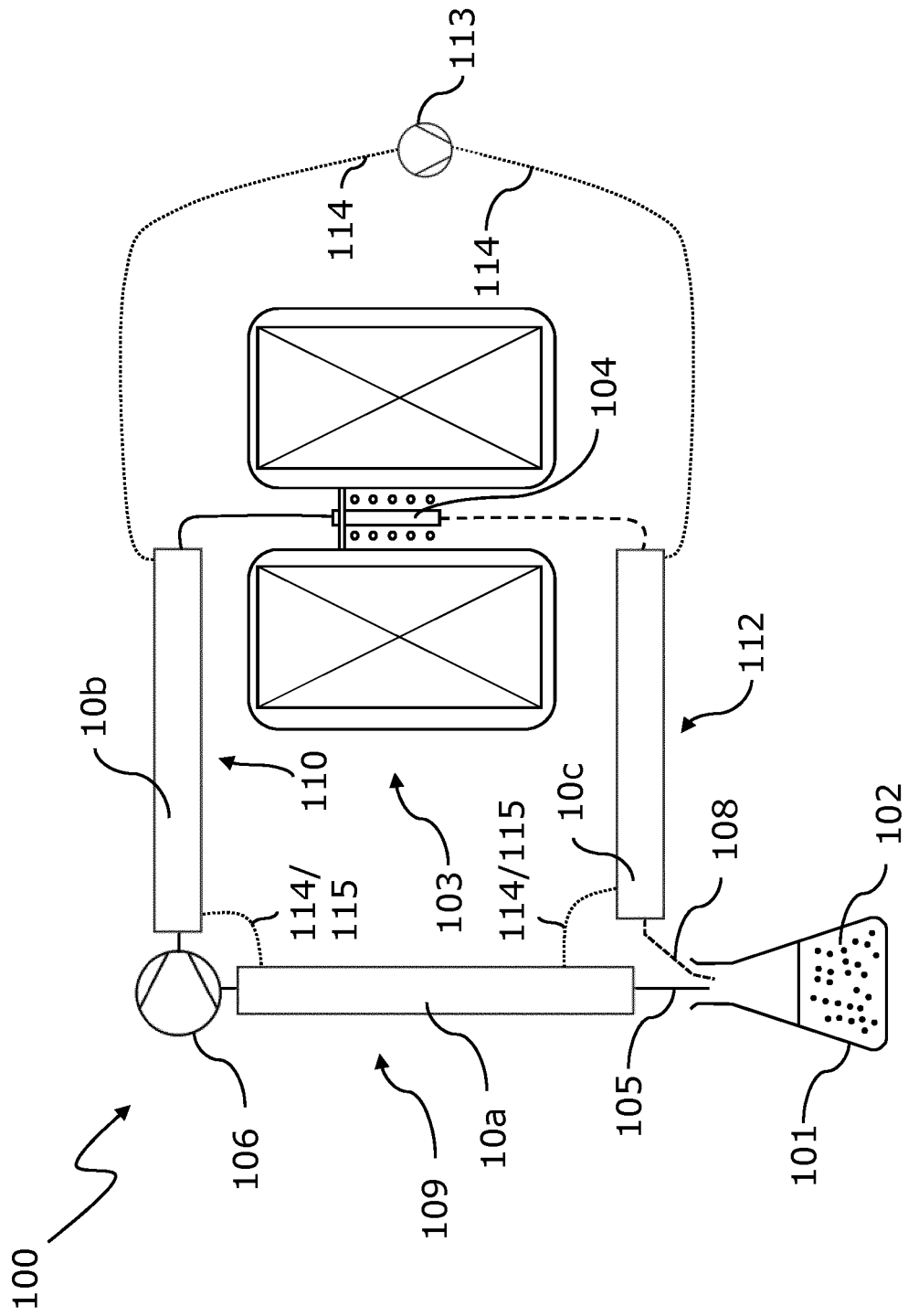
FIG. 4 is a schematic view of a measurement setup for performing an NMR measurement by means of an NMR spectrometer, using the monitoring device according to the invention.

FIG. 4 shows a schematic measurement setup for performing an NMR measurement using a monitoring device 100 according to the invention.

According to the invention, this has a closed temperature-control circuit for the temperature-control fluid 25, which circuit is geometrically designed such that the temperature-control fluid 25 always flows only in a predetermined direction in each spatial region of this temperature-control circuit, and no opposing flow of the temperature-control fluid 25 in the immediate vicinity of the spatial region occurs.

A reaction liquid 102 is produced in a reaction tank 101. This reaction liquid 102 is conducted to the NMR spectrometer 103, into an NMR sample probe 104 located therein, in order to measure, there, chemical reactions in real time by means of NMR spectroscopy.

The reaction liquid 102 is transported to the sample probe 104 via the inlet transport capillary 105 (shown here as a solid line). For this purpose, the reaction liquid 102 is conducted further into the NMR sample probe 104 by means of a pump device 106. The measured reaction liquid 102 is guided into the reaction tank 101 via the outlet transport capillary 108 (shown here as a dashed line).

For uniform temperature control of the reaction liquid 101 over the entire measurement setup, the transport capillaries 105, 108 extend in three portions 109, 110, 112 in each case through the devices 10a, 10b, 10c for conducting temperature-control fluid. In the portions 109 and 110, only the inlet transport capillary 105 extends through the devices 10a, 10b. In portion 112, only the outlet transport capillary 108 extends through the device 10c.

The temperature-control fluid is pumped (conducted) via a fluid pump 113 into the devices 10a, 10b, 10c. The fluid pump 113 and the devices 10a, 10b, 10c are interconnected via fluid lines 114 (four fluid lines 114 in the example shown here, shown as dotted lines) (the fluid connections at the devices 10a, 10b, 10c are not shown for the sake of clarity). In the example shown here, the temperature-control fluid is guided from the fluid pump 113, in the clockwise direction, via the fluid lines 114, first into the device 10c, then into the device 10a, from there into the device 10b, and from there back to the fluid pump 113 again. This is therefore a closed temperature-control circuit, whereby uniform temperature control can be achieved. In the example shown here, it is noted that the reaction tank 101 and the pump device 106 are not connected to the fluid pump 113 via fluid lines 114. The fluid lines 114 are each formed as a bypass 115 leading past the reaction tank 101 and the pump device 106.

LIST OF REFERENCE SIGNS 10, 10a-10c device (for conducting temperature-control fluid)
11a, 11b end piece
12, 12a, 12b, 12c central piece
13a, 13b fluid connection
14a, 14b multiple variant, multiple-variant end piece
15, 15a, 15b, 15c capillary receptacle
16a', 16a'' end portion (at the lower end)
16c', 16c'' end portion (at the upper end)
17b', 17b'' intermediate portion
18a, 18b single variant, single-variant end piece
19 outer partial tube
20 outer sealing sleeve
21, 21', 21'' inner partial tube
22 inner sealing sleeve
23 (double-walled) tube portion
24 intermediate region
25 temperature-control fluid
26 temperature-control channel
100 monitoring device
101 reaction tank
102 reaction liquid
103 NMR spectrometer
104 NMR sample probe
105 inlet transport capillary
106 pump device
108 outlet transport capillary
109 portion (between reaction tank and pump device)
110 portion (between pump device and NMR spectrometer)
112 portion (between NMR spectrometer and reaction tank)
113 fluid pump
114 fluid lines
115 bypass
$d_{aa}$ outer diameter (of the outlet transport capillary)
$d_{ae}$ outer diameter (of the inlet transport capillary)
$d_i$, $d_{i'}$, $d_{i''}$ inner diameter (of the inner partial tube)

LIST OF REFERENCES

Publications taken into consideration for the assessment of patentability:
[0] FOLEY, David A., et al. "NMR flow tube for online NMR reaction monitoring" Analytical chemistry, 2024, vol. 86, no. 24, pp. 12008-12013
[1] DE 10 2015 206 030 B3≈EP 3 076 197 B1≈U.S. Pat. No. 9,476,848 B1
[2] EP 2 407 796 B1≈U.S. Pat. No. 8,686,729 B2
[3] InsightMR, Bruker Corporation, Billerica, Massachusetts, USA

The invention claimed is:

1. A monitoring device for performing a measurement of a reaction liquid produced in a reaction tank in an NMR spectrometer, the monitoring device comprising:
a hollow NMR sample probe for receiving the reaction liquid to be measured in the NMR spectrometer;
an inlet transport capillary for receiving the reaction liquid from the reaction tank and for transporting the reaction liquid from the reaction tank via a pump device toward the sample probe;
an outlet transport capillary for the return transport of the reaction liquid from the sample probe to the reaction tank;
a device configured to conduct temperature-control fluid around the inlet and outlet transport capillaries, the device comprising tube portions, each of which is constructed in double-walled fashion from two radially closed partial tubes arranged nested in one another, including an outer partial tube and an inner partial tube, the temperature-control fluid flowing between the outer and the inner partial tube and the inlet transport capillary or the outlet transport capillary being arranged radially within the inner partial tube; and
a closed temperature-control circuit that is geometrically designed arranged such that, in each of a plurality of spatial regions, the temperature-control fluid during operation always flows only in a predetermined direction with no opposing flow of the temperature-control fluid in an immediate vicinity thereof.

2. The monitoring device according to claim 1, wherein the inner partial tubes are arranged concentrically with respect to the outer partial tubes.

3. The monitoring device according to claim 1, wherein the inner partial tubes are geometrically configured such that the inlet transport capillary and the outlet transport capillary can be inserted into and removed from the inner partial tubes.

4. The monitoring device according to claim 3, wherein inner diameters of the inner partial tubes are configured so as to be larger than or equal to outer diameters of a corresponding inlet transport capillary or a corresponding outlet transport capillary.

5. The monitoring device according to claim 4, wherein the inner partial tubes comprise a material having a coefficients of friction $\mu \leq 1$ and/or an expandable material.

6. The monitoring device according to claim 1, wherein the double-walled tube portions of the device for conducting temperature-control fluid around the inlet and outlet transport capillaries are part of a kit, and are independent, replaceable, units.

7. The monitoring device according to claim 6, wherein the double-walled tube portions are configured as closed units of a predetermined length.

8. The monitoring device according to claim 1, wherein the device for conducting temperature-control fluid around the inlet and outlet transport capillaries comprises end pieces for connecting the double-walled tube portions to a fluid pump.

9. The monitoring device according to claim 8, wherein the end pieces comprise multiple variant end pieces that simultaneously receive a plurality of inlet or outlet transport capillaries for different reaction liquids.

10. The monitoring device according to claim 9, wherein each multiple-variant end piece is configured to receive a plurality of inlet or outlet transport capillaries, all of which are temperature-controlled at the same time via a single temperature-control channel.

11. The monitoring device according to claim 10, wherein each multiple-variant end piece has two mutually opposite end portions and an intermediate end portion each configured to receive a different capillary that is coupled into a different inner partial tube, and wherein an outer partial tube corresponding to the intermediate end portion is in fluid communication with an outer partial tube corresponding to one of the mutually opposite end portions.

12. The monitoring device according to claim 11, further comprising central pieces located between the end portions and intermediate portions of a first multiple-variant end piece, and the end portions and intermediate portions of a second multiple-variant end piece, each central piece encompassing a single capillary surrounded by one of the tube portions.

13. The monitoring device according to claim 8 wherein, for each double-walled tube portion, the inner partial tube extends into the corresponding end portion by a greater length than the outer partial tube.

14. The monitoring device according to claim 1, wherein the transport capillaries have identical outer dimensions.

15. The monitoring device according to claim 1, wherein the transport capillaries are made of a chemically inert plastic material.

* * * * *